United States Patent [19]

Wakita et al.

[11] Patent Number: 4,964,776
[45] Date of Patent: Oct. 23, 1990

[54] ARTICLE TRANSFER AND STORAGE SYSTEM

[75] Inventors: Yuji Wakita; Hideaki Haruna, both of Himeji, Japan

[73] Assignee: Tsubakimoto Chain Co., Osaka, Japan

[21] Appl. No.: 265,839

[22] Filed: Nov. 1, 1988

[30] Foreign Application Priority Data

Dec. 1, 1987 [JP] Japan .............................. 62-301516
Dec. 28, 1987 [JP] Japan ........................ 62-197418[U]
Apr. 20, 1988 [JP] Japan .......................... 63-52122[U]

[51] Int. Cl.$^5$ .............................................. B65G 1/04
[52] U.S. Cl. ................................. 414/277; 414/282; 414/751; 901/21
[58] Field of Search ............... 414/281, 282, 283, 284, 414/277, 278, 279, 280, 266, 267, 749, 751; 901/21, 15

[56] References Cited

U.S. PATENT DOCUMENTS

| | | | |
|---|---|---|---|
| 3,458,061 | 7/1969 | Landry | 414/281 X |
| 3,490,616 | 1/1970 | Castaldi | 414/282 X |
| 3,782,565 | 1/1974 | Doran et al. | 414/277 X |
| 3,809,259 | 5/1974 | Pipes | 414/280 |
| 4,619,575 | 10/1986 | Summa et al. | 414/280 |
| 4,735,539 | 4/1988 | Häkkinen et al. | 414/281 |
| 4,824,311 | 4/1989 | Mims | 414/281 X |

FOREIGN PATENT DOCUMENTS

| | | | |
|---|---|---|---|
| 56-43108 | 4/1981 | Japan | 414/279 |
| 59-212302 | 12/1984 | Japan | 414/281 |
| 59-223602 | 12/1984 | Japan | 414/281 |
| 158669 | 12/1963 | U.S.S.R. | 414/281 |
| 2153801 | 8/1985 | United Kingdom | 414/282 |

Primary Examiner—Robert J. Spar
Assistant Examiner—Robert S. Katz
Attorney, Agent, or Firm—Flynn, Thiel, Boutell & Tanis

[57] ABSTRACT

An article transfer and storage system provided with a stationary stocker capable of storing a plural number of articles and a stock handler located movably on the front side of the stationary stocker. The travel drive mechanism for the stock handler is received in a lower portion of the stationary stocker. The stock handler includes an arm mechanism having a drive arm and a follower arm flexibly connected to each other by an intermediate shaft, and an article holder provided at an end of the follower arm. An operating mechanism translates rotation of a drive shaft into horizontal movement of the article holder. Each one of the arms has a hollow box-like shape to accommodate the operating mechanism.

13 Claims, 26 Drawing Sheets

ARTICLE TRANSFER AND STORAGE SYSTEM

FIELD OF THE INVENTION

This invention relates to a system for transferring and storing articles, which is particularly suitable for use as semiconductor production equipment and which is provided with a stationary stocker and a stock handler for transferring articles to and from the stocker.

BACKGROUND OF THE INVENTION

An article transfer and storage system of this sort is described in Japanese Laid-Open Utility Model Application No. 62-124906. This article transfer and storage system, as indicated generally at A in FIGS. 25 and 26, is provided with a stock handler 22 which is movable both in the vertical direction (upward and downward of the drawing) and in the horizontal direction (vertical to the face of the drawing) along the front side (the left side in the drawing) of a stationary stocker 21, which is provided with a plural number of shelves 20 for storing articles W and positioned in a direction vertical to the face of the drawing, for transferring articles between an unmanned carrier 23 and the stationary stocker 21 in the transverse directions in the drawing. Indicated at 24 are rails for guiding the vertical movements of the stock handler 22.

Such a transfer and storage system, however, has a problem in that a traveling mechanism 25 for the stock handler 22 is located under the handler 22 and is positioned between the stationary stocker 21 and the unmanned carrier 23, necessitating a broad space H between the stationary stocker 21 and unmanned carrier 23 and therefore requiring a large floor space for installation of the system as a whole. This is obviously disadvantageous especially in case of a clean room accommodating semiconductor production equipment where the floor space per unit area is very costly and is desired to be as small as possible.

The stock handler 22 further includes a motor unit 27 mounted on a base plate 26 which is movable transversely and at the same time liftable up and down along the front side of the stationary stocker 21, a linear guide rail 28 movable on the motor unit 27 toward and away from the stationary stocker 21, and a work support 29 movable on the linear guide rail 28.

The transfer of articles W between the stationary stocker 21 and the unmanned carrier 23 is effected by placing an article or work W on the work support 29 and moving the motor unit 27, linear guide rail 28 and work support 29 additively on the base plate (FIG. 26) or by summing the displacements of these three members. However, the handler 22 of such arrangement has a problem in that the motor unit 27, linear guide rail 28 and work support 29 make dust as they are moved additively on the base plate 26.

SUMMARY OF THE INVENTION

It is an object of the present invention to solve the above-mentioned problems by the provision of an article transfer and storage system which is provided with a stationary stocker capable of storing a plural number of articles and a stock handler located movably on the front side of the stationary stocker and in which the travel drive mechanism for the stock handler is received in a lower portion of the stationary stocker.

The stock handler is moved along the front side of the stationary stocker to transfer articles when necessity arises. Since the drive mechanism for the travel of the stock handler is received in a lower portion of the stationary stocker, the lower portion of the stationary stocker including the drive mechanism can be formed to have a depth only slightly larger than the depth of the stationary stocker itself, permitting reduction in the floor space for the handling and storage section to a marked degree.

According to another aspect of the invention, there is provided a stock handler, including: an arm mechanism having a drive arm and a follower arm flexibly connected to each other by an intermediate shaft, a follower shaft having an article holder means and provided at an end of the follower arm and a drive shaft provided at an end of the drive arm; and an operating mechanism for translating rotation of the drive shaft into horizontal movement of the follower shaft; each one of the arms having a hollow box-like shape to accommodate the operating mechanism.

Upon actuating the drive shaft, the drive arm which is connected to the drive shaft is rotated and thereby the follower arm is rotated about the intermediate shaft. While maintaining the article holder means in horizontal state, the arm mechanism is flexed (at a joint) by the operating mechanism to send articles in and out.

The operating mechanism which is accommodated in a box-like arm has no possibility of releasing to the outside the dust which may result from its operation.

According to a third aspect of the invention, there is provided a stock handler, including a drive arm and a follower arm flexibly connected to each other by a link shaft, a drive shaft provided at an end of the drive arm, an article transfer means provided at an end of the follower arm, and an operating mechanism for turning the follower arm by transmitting the rotation of the drive arm to the link shaft, the drive arm having a box-like shape to accommodate the operating mechanism therein, and the article transfer means being substantially in the form of a thin plate.

In order to send out an article from a shelf, firstly the drive arm is rotated horizontally by the drive shaft, extending the follower arm horizontally toward the shelf by the operating mechanism to touch down the transfer means alone on the shelf. As soon as the transfer means is advanced to a position beneath the article on the shelf, the horizontal rotational movement of the drive arm is stopped. Nextly, the stock handler as a whole is lifted up slightly to scoop from beneath the article to place same on the transfer means. Then, the drive arm is horizontally rotated in the reverse direction to turn the follower arm away from the shelf through the operating mechanism to take out the article. At this time, the article is removed from the shelf substantially linearly.

In order to place an article on a storage shelf, firstly the drive arm is turned horizontally to extend the follower arm toward the shelf through the operating mechanism, advancing onto the shelf the transfer means alone at a level slightly higher than the shelf together with an article. As soon as the transfer means comes to a position above the shelf, the horizontal rotation of the drive arm is stopped. Then, the stock handler as a whole is lowered slightly to place the article on the storage shelf. After this, the drive arm is turned reversely to rotate the follower arm in a direction away from the shelf for withdrawing same from the shelf.

BRIEF DESCRIPTION OF THE DRAWINGS

FIGS. 1 through 24 illustrate preferred embodiments of the transfer and storage system according to the present invention, of which:

FIG. 1 is a schematic perspective of the system as a whole;

FIG. 2 is a right-hand side view of the system shown in FIG. 1;

FIG. 3 is a schematic front view of a stationary stocker, omitting part of a lift drive section;

FIG. 4 is a right-hand side view of the stocker shown in FIG. 3;

FIG. 5 is a sectional view taken on line 5—5 of FIG. 3;

FIG. 6 is a sectional view showing, on an enlarged scale, the lower part of the stocker of FIG. 3;

FIG. 7 is a sectional view taken on line 7—7 of FIG. 6;

FIG. 8 is a horizontal section of the stationary stocker, with a support column moved to a position at the rightmost end of the stocker and a lift unit in a lowered position;

FIG. 9 is a front view of the components shown in FIG. 8;

FIG. 10 is a right-hand side view of the components shown in FIG. 8;

FIG. 11 is a schematic perspective view of hand unit arm, sprockets and chains in assembled state;

FIG. 12 is an enlarged sectional view of a first embodiment of the hand unit;

FIG. 13 is a front view of the hand unit of FIG. 12;

FIGS. 14 to 17 are side views showing modifications of the transfer and storage system;

FIG. 18 is a diagrammatic illustration showing the dimensional relationship between a hook and an article;

FIG. 19 is a sectioned front view of a second embodiment of the hand unit;

FIG. 20 is a plan view of the hand unit of FIG. 19;

FIG. 21 is a plan view employed for explaining the operation of the hand unit of FIGS. 19 and 20;

FIG. 22 is a sectioned front view of a third embodiment of the hand unit;

FIG. 23 is a plan view of the hand unit of FIG. 22;

DESCRIPTION OF PREFERRED EMBODIMENTS

Now, some preferred embodiments of the invention are described with reference to the accompanying drawings.

The article transfer and storage system B according to the invention is composed of a stationary stocker 30 (also knows as an upright storage rack) for storing a plural number of articles or workpieces W, a stock handler which is positioned in front of the stationary stocker 30 and movable along the front side of the stationary stocker in both vertical and horizontal directions, and an unmanned carriage 32 for transferring an article W parallel with and along the front side of the stationary stocker.

As shown particularly in FIGS. 1 through 5, the stationary stocker 30 is provided with a plural number of vertically spaced shelves 33 each for storing plural articles W thereon.

Figure 4:
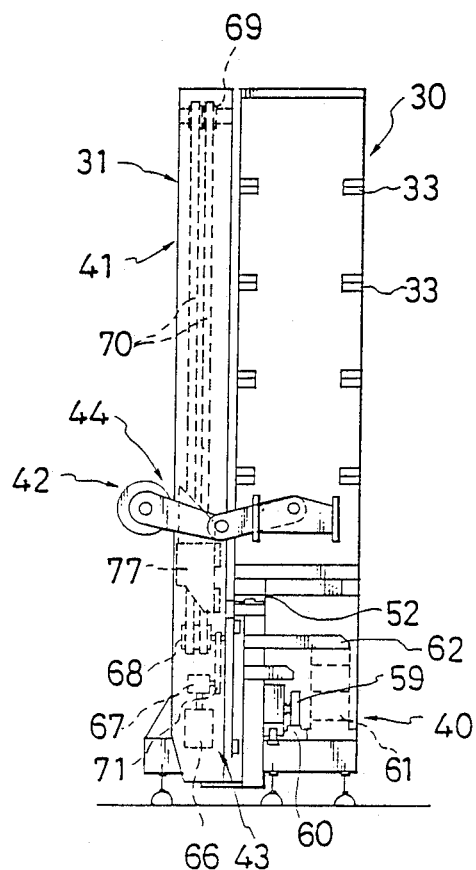
Figure 5:
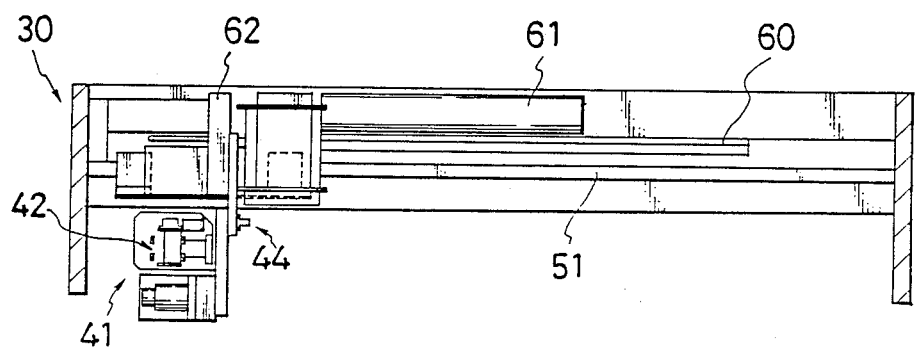

As illustrated in FIG. 4, the stock handler 31 includes a traveling drive section 40 which is provided in a lower portion of the stationary stocker 30 and movable along the floor surface, a support column 41 positioned on the front side (the left side in FIG. 4) of the traveling drive section 40, a lift unit 42 movable up and down along the front side of the support column 41, and a lift drive section 43 for moving the lift unit 42 up and down. The lift unit 42 is provided with a hand unit 44 for transferring an article W between the stationary stocker 30 and the unmanned carriage 32.

Figure 6:
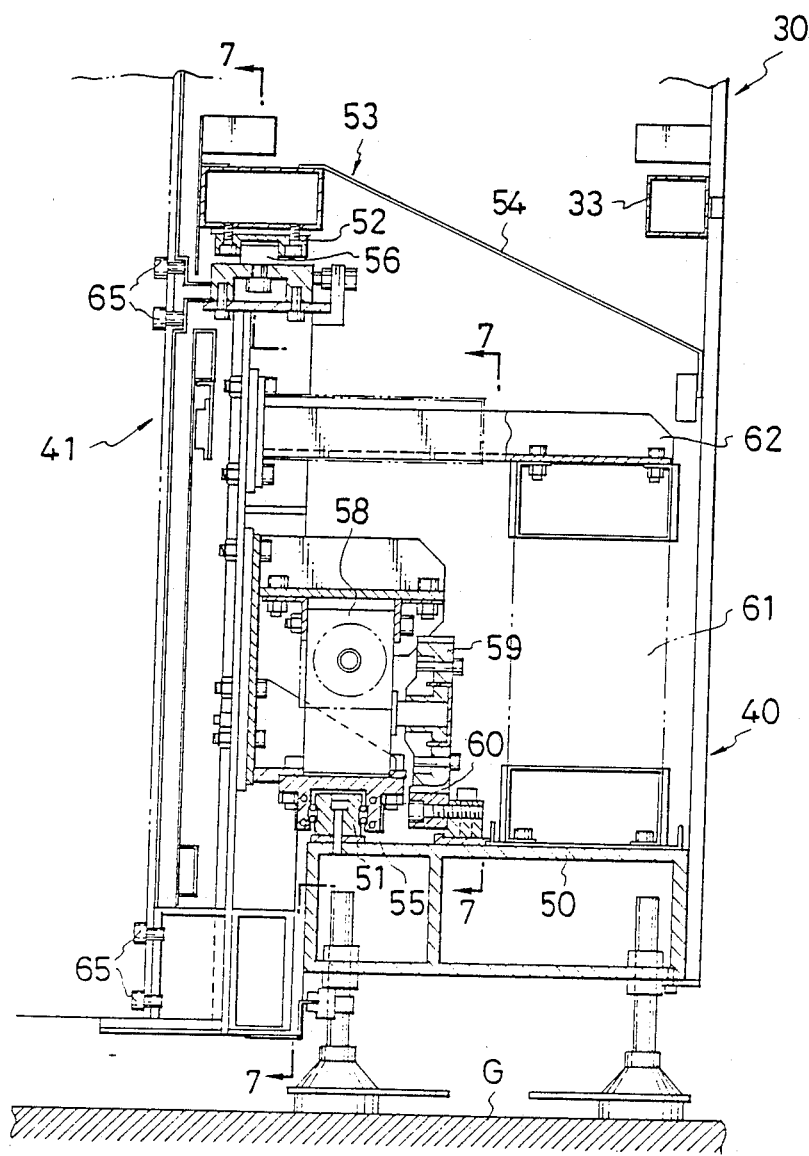
Figure 7:
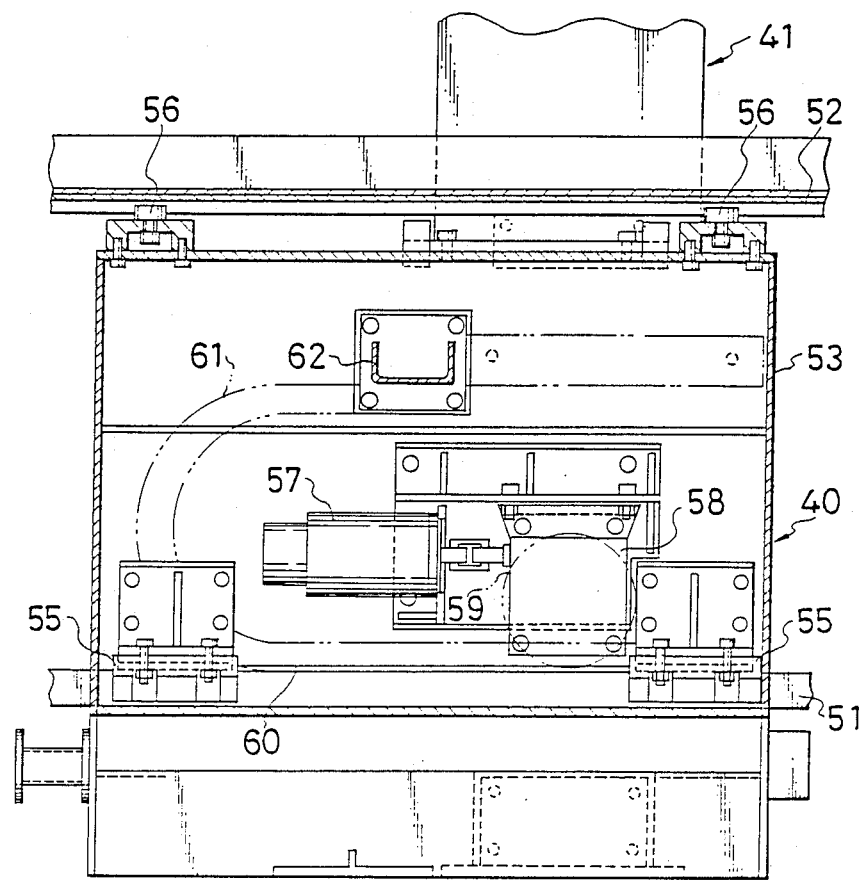

The traveling drive section 40 has the construction as shown particularly in FIGS. 6 and 7. The whole mechanism of the traveling drive section 40 is movable under guidance of a lower rail 51 provided on the bottom 50 of the stocker and an upper rail 52 provided on the lower side of the lowermost shelf. Further, the whole traveling drive section 40 is housed in a sealed state in a casing 53, the top wall 54 of which declines to the right in FIG. 6. This sealing prevents scattering of dust from the traveling drive section 40, while the declined top surface 54 is formed to restrict the flows of clean air which is blown thereto from above. A bearing 55 for rectilinear motion is provided in a lower portion of the casing 53, astride the lower rail 51. Further, a pair of rollers 56 which are in engagement with and guided by the upper rail 52 are provided in an upper portion of the casing 53. An AC servo motor 57 with a brake is horizontally mounted in the casing 53 on the left side in FIG. 7. The AC servo motor 57 is connected to a worm reducer 58, which reducer 58 has a pinion 59 mounted on its output shaft. The pinion 59 is meshed with a gear rack 60 which is mounted on the bottom wall 50 and is positioned parallel with the lower rail 51. Provided above the AC servo motor 57 is a horizontal beam 62 which supports one end of a cable protecting mechanism 61. The cable protecting mechanism 61, which is of a chain-like shape, has the other end positioned on the bottom wall portion 50 of the stationary stocker 30 and serves to protect the power supply cables of the traveling drive section 40 and for the lift unit 42 and lift drive section 43 which will be described hereinafter.

Figure 1:
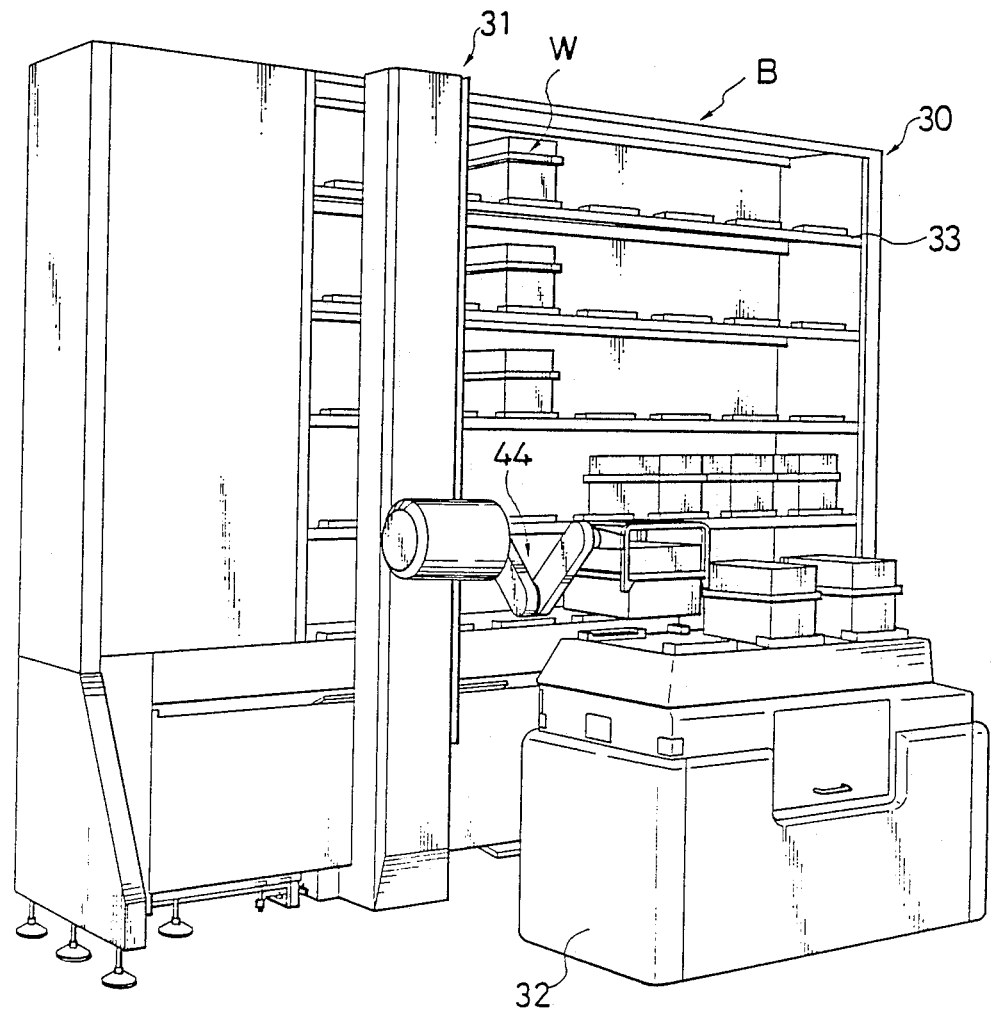
Figure 2:
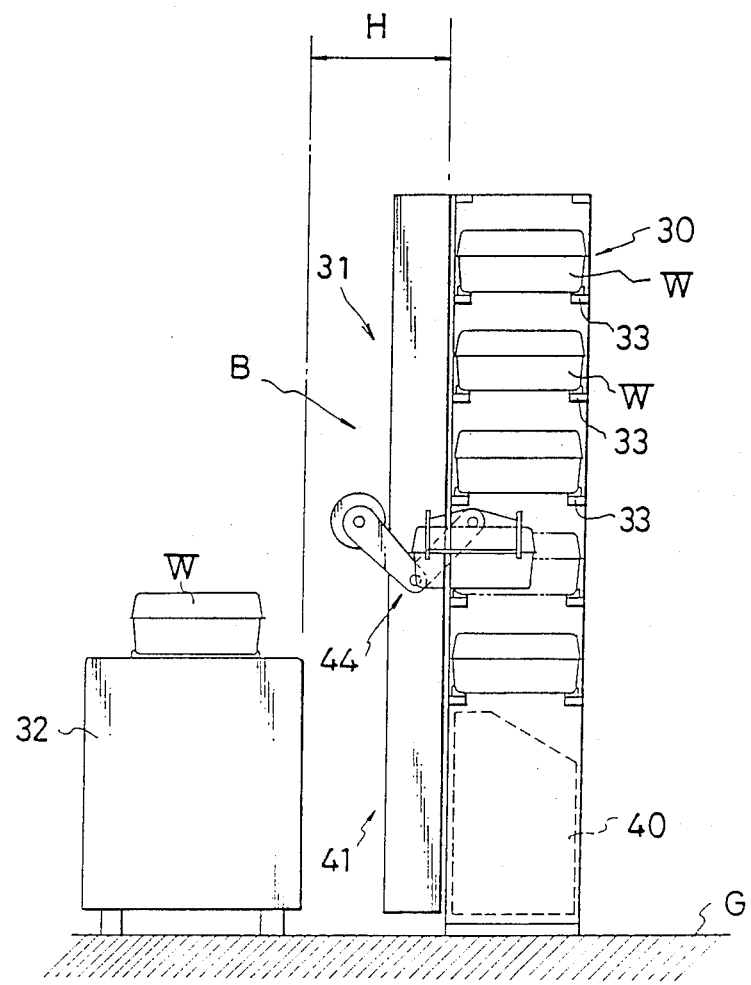
Figure 3:
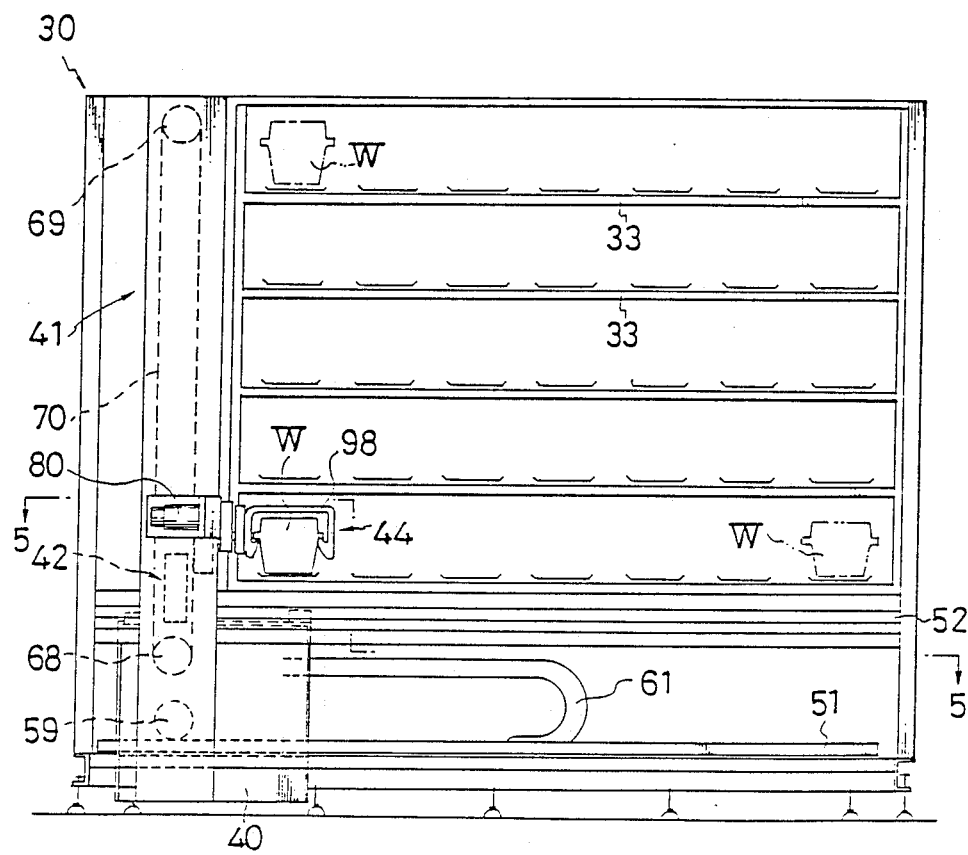

The traveling drive section 40 operates as follows:

Upon driving the AC servo motor 57, the rotational speed of the motor is reduced through the worm reducer 58 to rotate the pinion 59 at low speed, the rotation being transmitted through the meshed rack 60 to move the stock handler 31 as a whole in the rightward and leftward directions in FIG. 3. At this time, the cable protecting mechanism 61 is flexed as the traveling drive section 40 is moved to protect the cables (not shown), precluding abnormalities of power supply.

Turning now to the lift drive section 43, the support column 41 has a rectangular shape in section and its lower portion is secured to the front side (the left side in FIG. 6) of the casing 53 of the traveling drive section 40 by means of bolts 65.

Provided internally of the support column 41 (FIG. 4) is the lift drive 43 for moving the lift unit 42 up and down as will be described hereinafter.

A lift motor 66 and a reducer 67 for reducing the output of the motor 66 are provided within a lower portion of the support column 41. Further, pulleys 68 and 69 are rotatably mounted within the support column 41 in the vicinity of the reducer 67 and at the upper end of the support column, respectively. Belts 70 are passed around pairs of these upper and lower pulleys 68 and 69, and a drive belt 71 is passed around the lower pulley 68 and the reducer 67.

Figure 8:
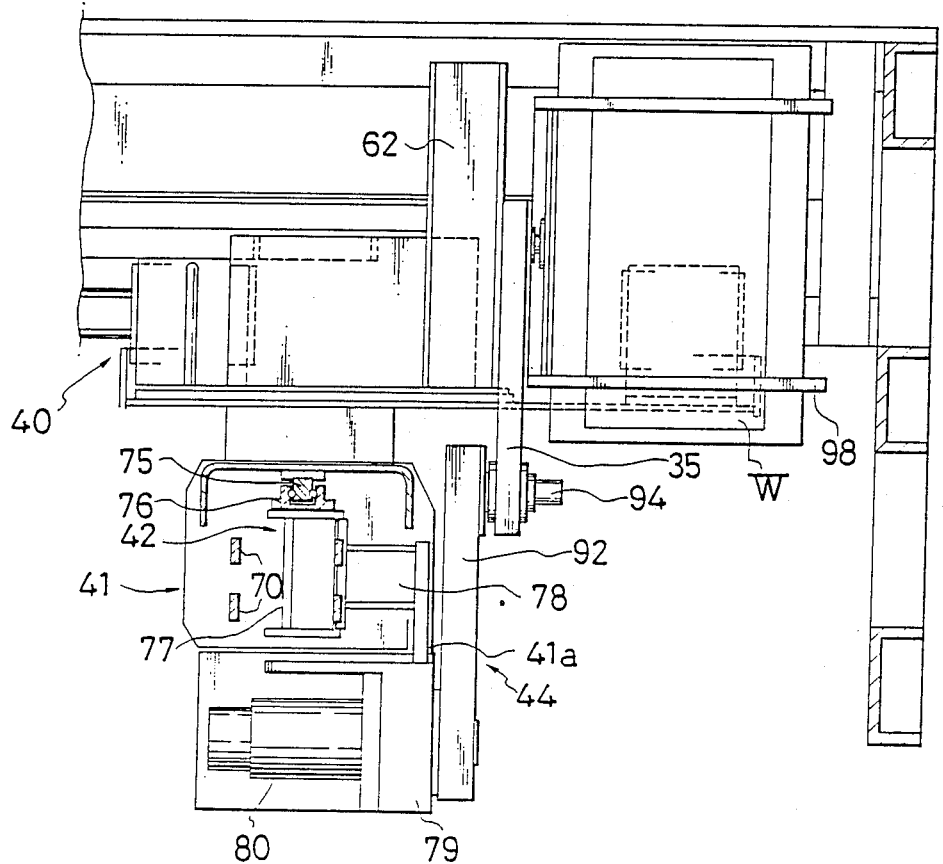
Figure 9:
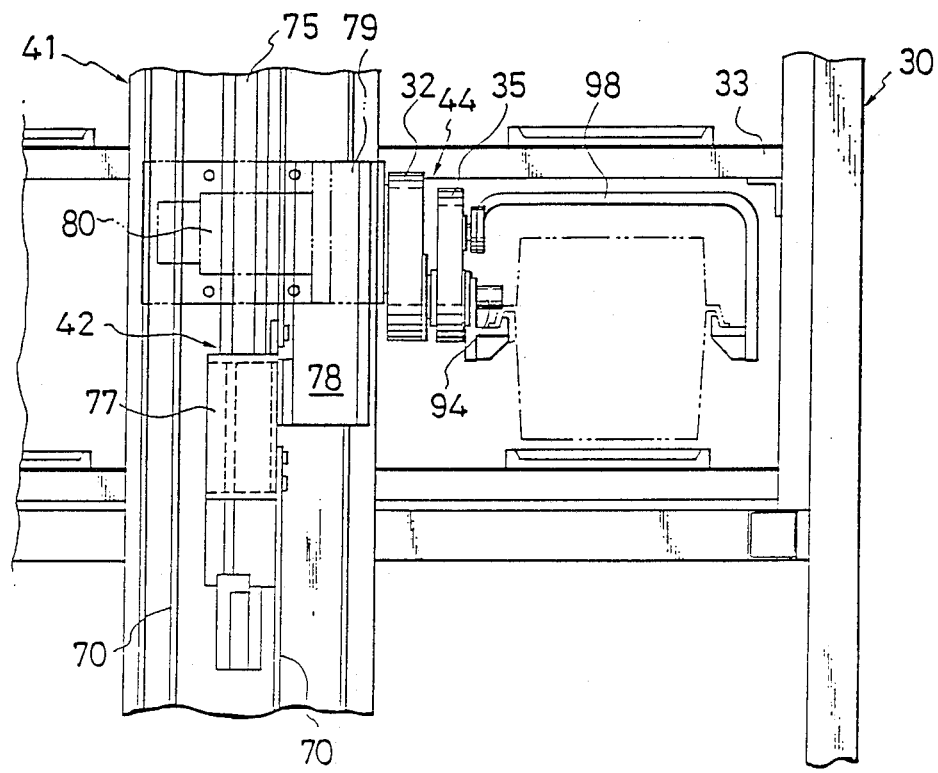
Figure 10:
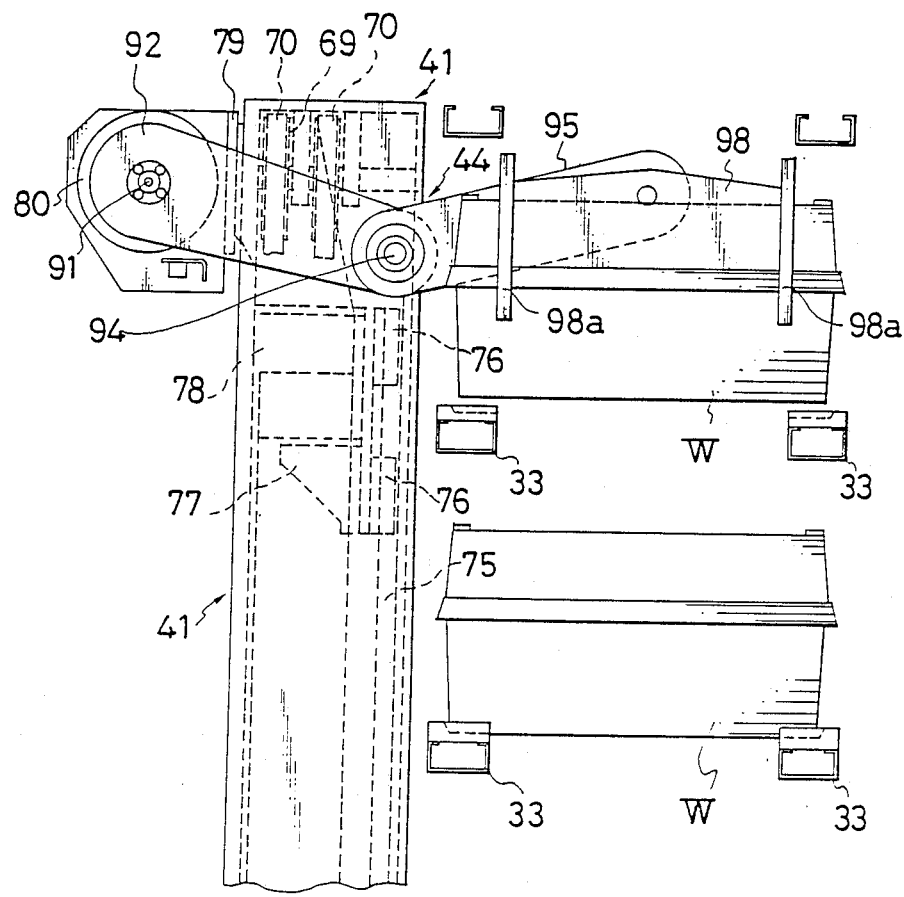

The lift unit 42 has a construction as illustrated in FIGS. 8 to 10. The lift unit 42 is movable vertically (in the upward and downward directions in FIG. 9) under guidance of a rail 75 which is fixedly provided within the support column 41 parallel with the vertical length of the support column. Provided astride the rail 75 are a pair of linear motion bearings 76 which are securely fixed on a support member 77. Provided at the right side (on the right side in FIG. 8) of the support member 77 is a link member 78 which protrudes through a slit 4 1a which is formed parallel with the length of the support column 41. The support member 77 is fixedly secured to the afore-mentioned belts 70. A lift unit frame 79 is securely supported at the end of the link member 78 which protrudes from the support column 41, and a hand unit motor 80 is horizontally mounted on the lift unit frame 79.

The lift unit 42 and the lift drive section 43 operate in the following manner:

Upon driving the lift motor 66, its rotation is reduced by the reducer 67 to drive a pair of belts 70 through the drive belt 71. As a result, the support member 77 provided on the belts 70 is moved vertically upward or downward under the guidance of the linear motion bearings 76 and guide rail 75. By this vertical upward or downward movement, the link member 78 on the support member 77 is also moved upward or downward, integrally accompanying therewith the lift unit frame 79.

Figure 11:
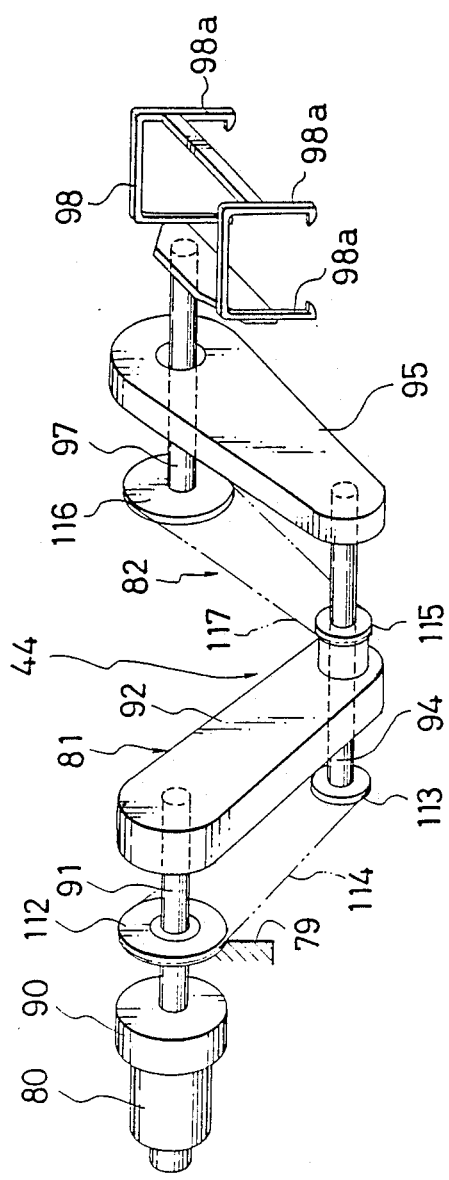
Figure 12:
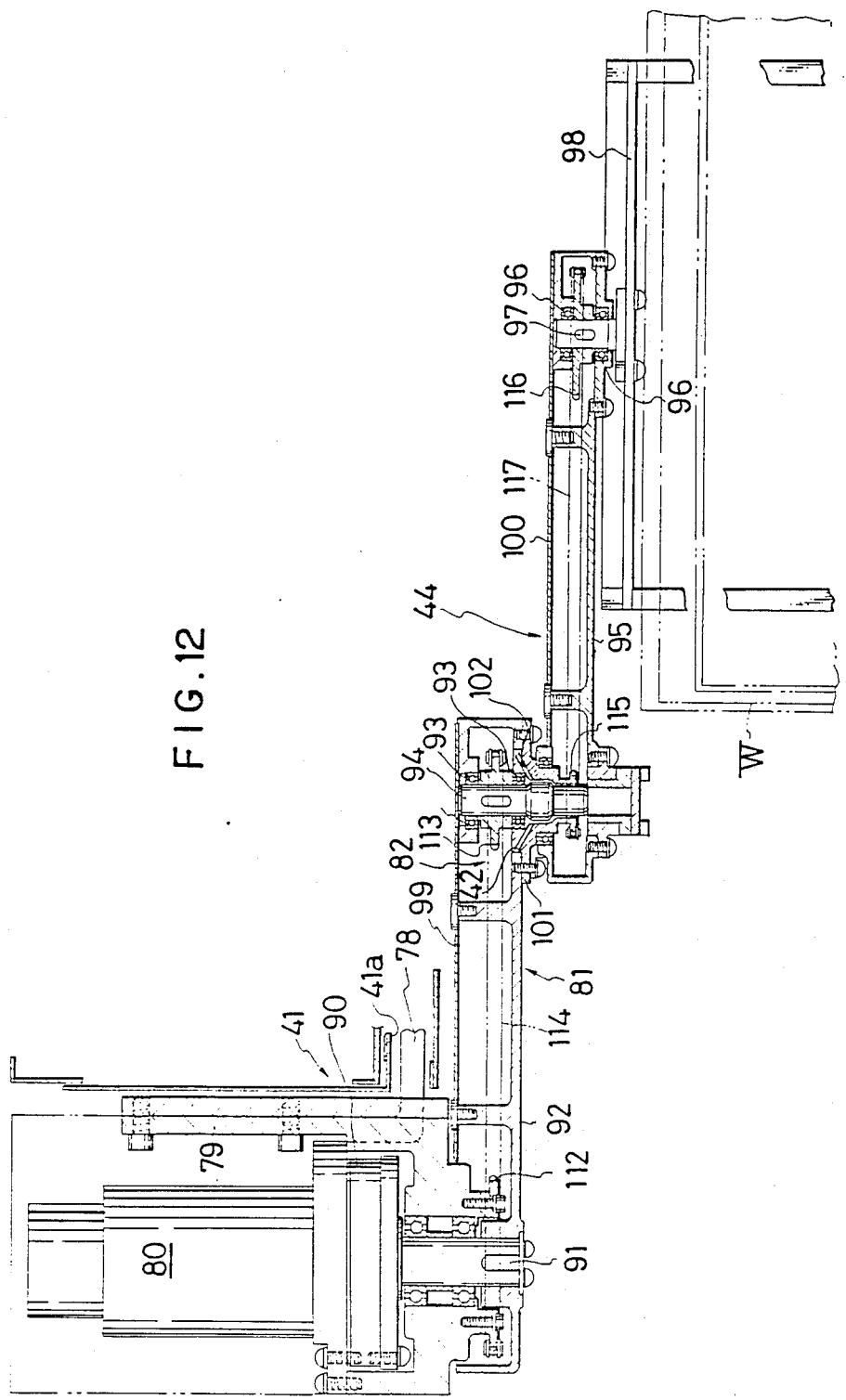

The hand unit 44 has a construction as shown in FIGS. 11 and 12. The entire structure of the hand unit 44 is mounted on the lift unit 42, including an arm mechanism 81 and an operating mechanism 82 which operates the arm mechanism 81. This hand unit operates generally within a vertical plane.

The arm mechanism 81 is capable of flexing movements (flexion at joints) to move an article W into and out of the stationary stocker 30.

One end of a drive arm 92 (the base end of the arm mechanism 81) is integrally connected to an output shaft 91 of a reducing mechanism 90 which will be described hereinafter. An intermediate shaft 94 is rotatably supported at the other end (i.e., the right end in FIG. 12) of arm 92 through bearings 93. A follower arm 95 is integrally connected to one end (i.e., the near end in FIG. 12) of the intermediate shaft 94. A follower shaft 97 is rotatably supported at the terminal or other end of the arm 95 (the fore end of the arm mechanism 81) through bearings 96. A hook member 98 for catching and holding the article W is attached to the follower shaft 97 on the near side thereof.

The above-described drive and follower arms 92 and 95 are formed of a box-like shape as a whole and sealingly closed on one side by covers 99 and 100, respectively, to shield the inside thereof, the two arms being communicated with each other through a hole 102 in a bearing member 101 which supports one of the aforementioned bearings 93.

Accordingly, the arm mechanism 81 as a whole is driven by the output shaft 91, turning the follower arm 95 about the intermediate shaft 94 for rotation relative to the drive arm 92.

Referring now to the operating mechanism 82, the frame 79 retains in position the drive motor 80 and the reducer mechanism 90 which is coupled with the drive motor 80, while rotatably supporting the output shaft 91 of the reducer mechanism 90. A sprocket 112 is fixed to the adjacent side of the frame 79 in coaxial relation with the output shaft 91, while a sprocket 113 is fixedly mounted on the intermediate shaft 94. The diametral ratio of these sprockets 112 and 113 is 2:1. A chain 114 is passed between and around these sprockets 112 and 113. The sprockets 112 and 113 and the chain 114 are all accommodated in the drive arm 92.

A further sprocket 115 is fixedly mounted at the near end of the bearing member 101 which is formed integrally with the drive arm 92. Another sprocket 116 is fixedly mounted on the follower shaft 97. The diametral ratio of the sprockets 115 and 116 is 1:2. A chain 117 is passed between and around these sprockets 115 and 116. The sprockets 115 and 116 and the chain 117 are all accommodated in the follower arm 95.

In FIG. 12, the reference numeral 78 denotes part of the drive mechanism which moves up and down within the support column 41 and which is provided with the frame 79.

Figure 13:
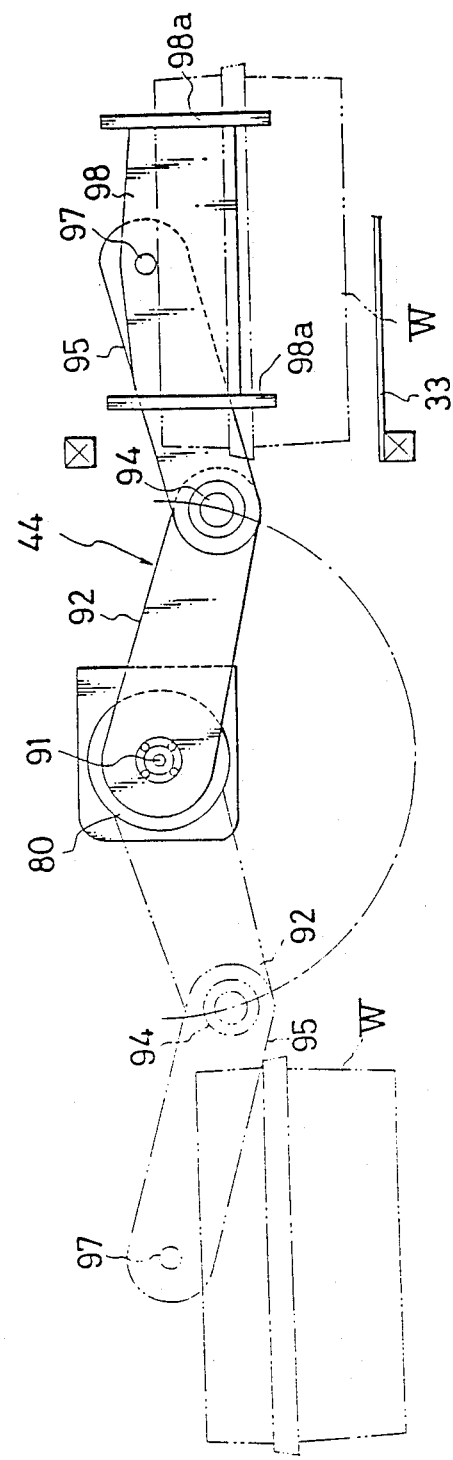

The operation for removing an article W from the stocker 30 is performed in the following manner:

In the first place, the drive and follower arms 92 and 95 are extended out until arm 95 is inserted in the space between the shelves 33 of the stationary stocker 30, which movement causes the hook 98 to partially surround the article W. Then the hand unit 44 as a whole is slightly lifted up by the lift drive section 43 so that the hook 98 is engaged with the article W to lift the article W slightly above the shelf 33. In this state, the drive motor 80 is driven to rotate the output shaft 91 at low speed through the reducing mechanism 90, thereby rotating the drive arm 92 rightward (clockwise) in FIG. 13. This rightward rotation of the drive arm 92 results in leftward (counterclockwise) rotation of the follower arm 95 about the intermediate shaft 94. At this time, however, the movement of the follower shaft 97 is restricted by the operating mechanism including the above-described sprockets 112, 113, 115 and 116 and the chains 114 and 117, and the fore end portion of the follower arm 95 is moved horizontally while holding the hook 98 in a horizontal state as shown in FIG. 13 to withdraw the article W slowly from the shelf 33. As the drive motor 80 is rotated further, the drive arm 92 continues its rightward (clockwise) rotation. Accordingly, the follower arm 95 continues its leftward (counterclockwise) rotation about the intermediate shaft 94, and the fore end portion (rightward end in FIG. 13) of the follower arm 95 approaches the drive shaft 91 by a horizontal linear movement. Consequently, the article W is removed from the shelf 33 in horizontal state.

As the drive arm 92 is rotated further to the position shown by double dot-dash lines on the left side of FIG. 13, the fore end portion of the follower arm 95 is horizontally moved to the left into a position immediately above the unmanned carrier 32. Thereafter, the hand unit 44 as a whole is lowered to place the article W on top of the unmanned carrier 32. The hook 98 is disengaged from the article W upon further slight lowering of the hand unit 44. Next, the drive arm 92 is turned rightward (counterclockwise) to withdraw the follower arm 95 from the unmanned carrier 32 to thereby complete the transfer operation.

For transfer of an article W from the unmanned carrier 32 to the stationary stocker 30, the above-described operation is reversed.

While transferring an article W to or from the stocker 30, air in the drive and follower arms 92 and 97 is suctioned in the vicinity of the drive shaft 91 at the base end of the drive arm 92 by means of an air suctioning mechanism (not shown) to evacuate the interiors of the two arms 92 and 97 for prevention of scattering of dust which might be produced by the chains, sprockets, bearings and so forth.

Next, the description is directed to the operation of the article transfer and storage system B as a whole.

In order to remove an article W which is stored on the stationary stocker 30, the support column 41 is horizontally moved by the traveling drive section 40 to a position where the article W to be dispatched is stored. Next, the lift drive section 43 is actuated to move the lift unit 42 vertically along the support column 41 to an elevation corresponding to the position of the article W to be dispatched. Then, the motor 80 of the hand unit 44 is actuated to move the hook 98 of the hand unit inwardly toward the article so that the fingers or hook parts 98a are disposed on opposite sides of the article W. In this state, the lift unit 42 is moved up a small distance to engage the hook parts 98a beneath the flange or lip of the article. The hand unit motor 80 is then rotated in the reverse direction to remove the article W from the shelf 33. The lift unit 42 with the dislodged article W is lowered or elevated to the level of the unmanned carrier 32 by again actuating the lift drive section 43. After this, the traveling drive section 40 is actuated to move the support column 41 until the lift unit 42 comes to a position at the side of the unmanned carrier 32. The article W which has been transferred to one side of the unmanned carrier 32 is then placed on the carrier 32 by releasing the holding action of the hand unit 44.

Figure 14:
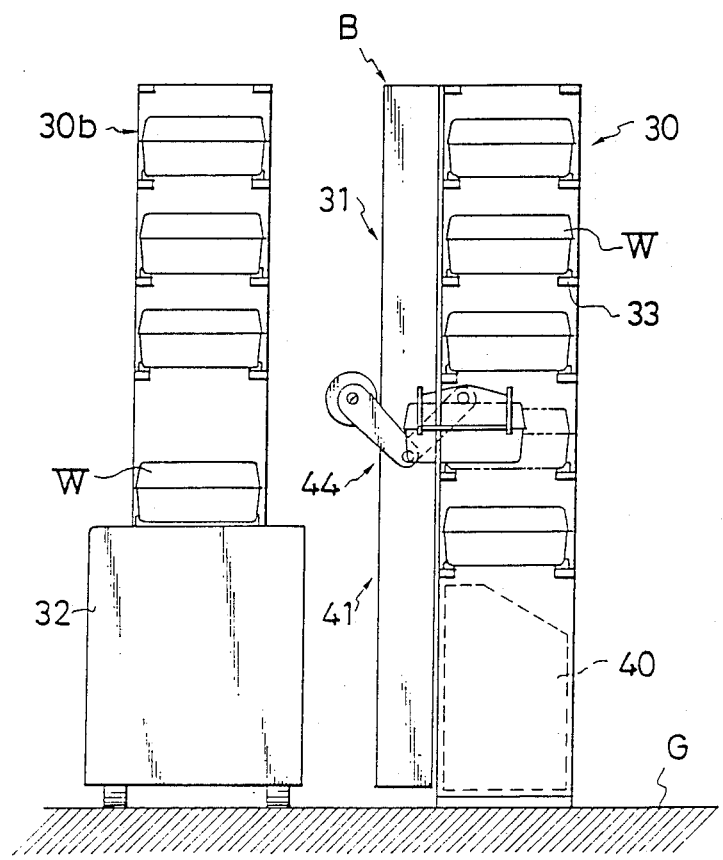
Figure 15:
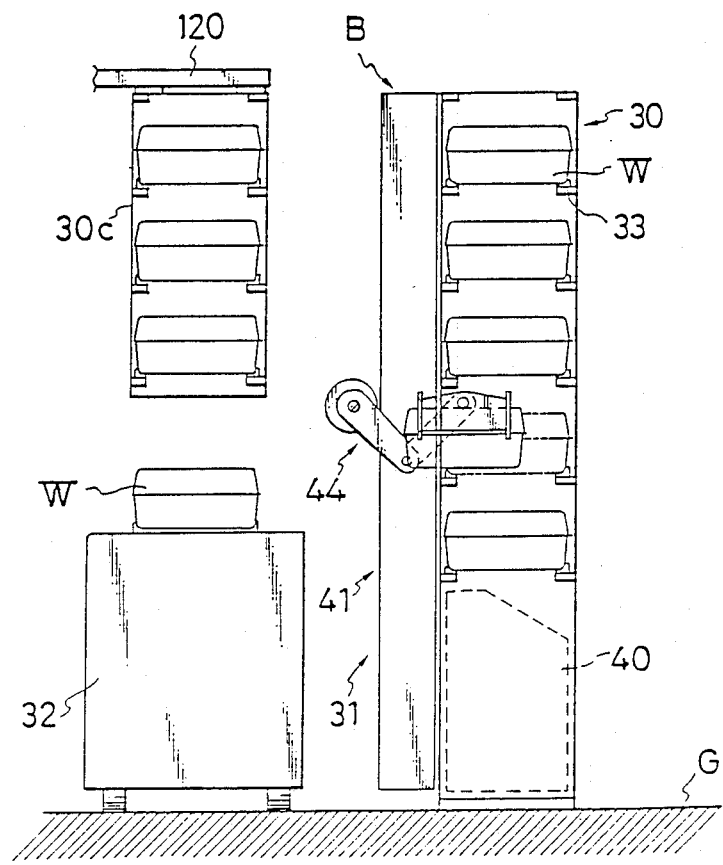
Figure 16:
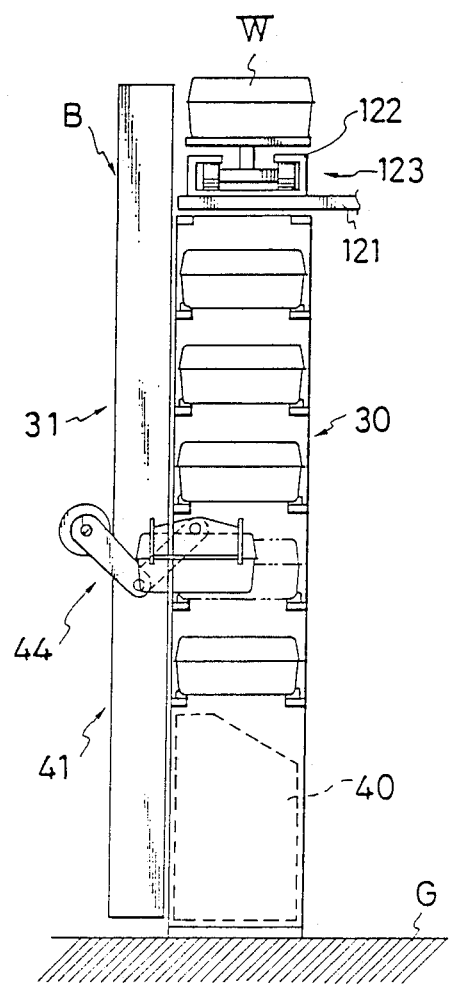
Figure 17:
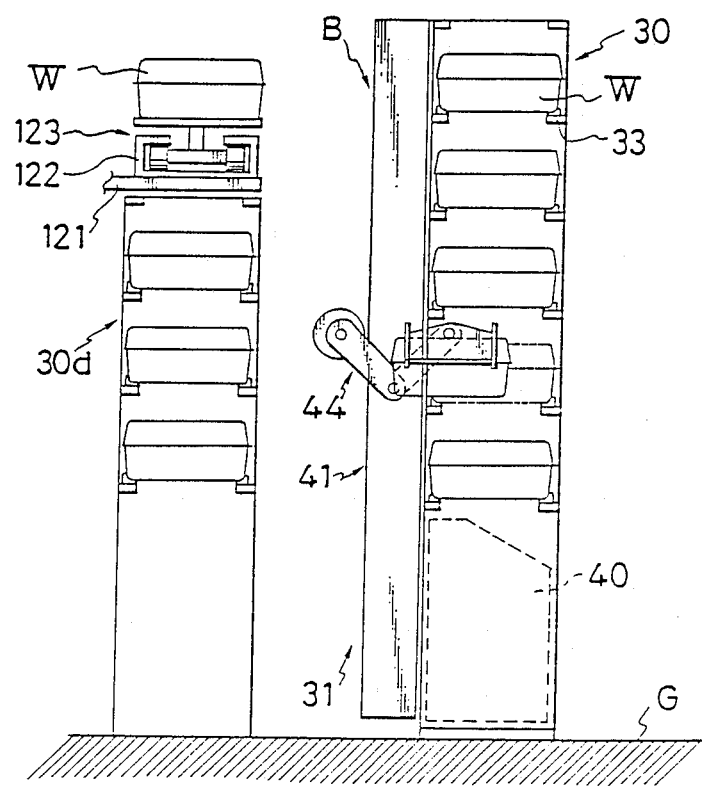

Although only one unit of the stationary stocker 30 is shown in the foregoing embodiment, one or more additional stocker units 30 B may be provided along the path of movement, as by being mounted on the unmanned carrier 32 as shown in FIG. 14 if necessary. Further, as illustrated in FIG. 15, an overhead type stocker 30C may be hung down from a ceiling beam 120 above the path of travel of the unmanned carrier 32 if desired. Instead of the unmanned carrier 32 which runs on the floor, there may be employed a track carrier 123 which is arranged to run along rails 122 fixed on a ceiling beam 121 located over stationary stockers 30 and 30d as shown particularly in FIGS. 16 and 17.

In the foregoing embodiments, the traveling drive section 40 of the stock handler 31 is movably provided in a lower portion of the stationary stocker 30 to reduce the floor space of the stock handler as compared with the floor space required exclusively for the stationary stocker and to narrow the distance H (FIG. 2) between the unmanned carrier 32 and the stationary stocker 30.

Further, the hand unit which is used to send in and out the articles W consists of a flexible multiple-link mechanism, so that it can adapt itself to narrow spaces, permitting the distance H to narrow all the more.

The stock handler 31 which is attached as a whole to the stationary stocker 30 unnecessitates the adjustments of the relative positions between the stock handler and the stationary stocker 30, which have thus far been invariably required.

When used in a clean room, the traveling drive section located in a lower portion of the stationary stocker 30 and the lift drive section 43 located in a lower portion of column 41 are less likely to scatter dust in the room while in operation.

In addition, the respective mechanisms are held in sealed state to preclude scattering of dust which might otherwise be released into the storage room. Namely, the following features in construction contribute to prevent dust scattering:

(1) The double-arm construction which is simple and small in size lessens the causes of dust production.

(2) Dust production is restricted to the arm joint portion to facilitate the provision of anti-dust measures.

(3) The mechanisms can be easily sealed in a simple hollow box-like arm which is internally reliably vacuumed.

Figure 18:
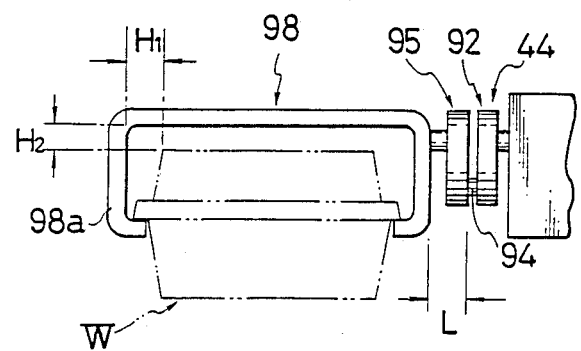

As shown in FIG. 18, the above-described hand unit 44 needs spaces $H_1$ and $H_2$ between the hook 98 and an article W to hang the article W on the hook member 98.

Figure 19:
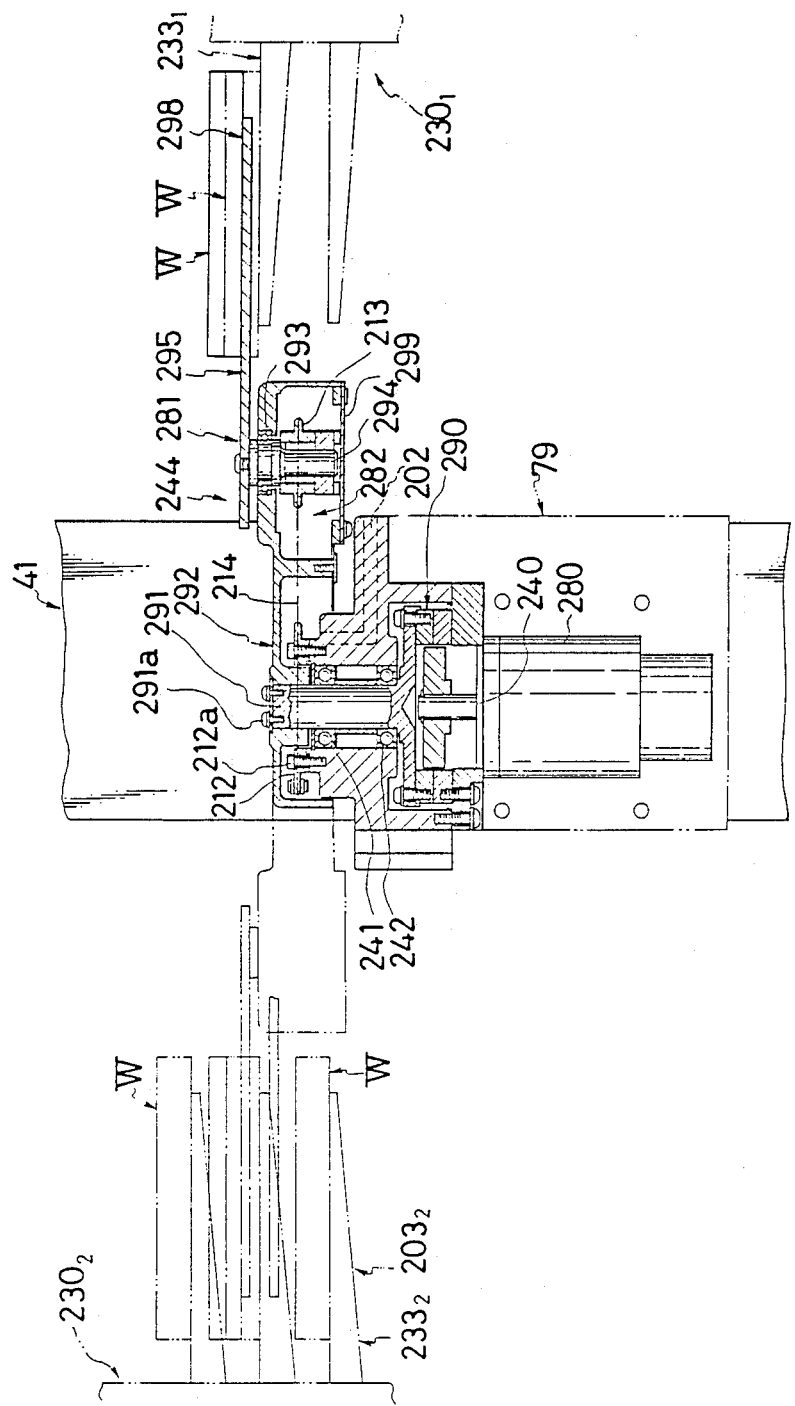
Figure 20:
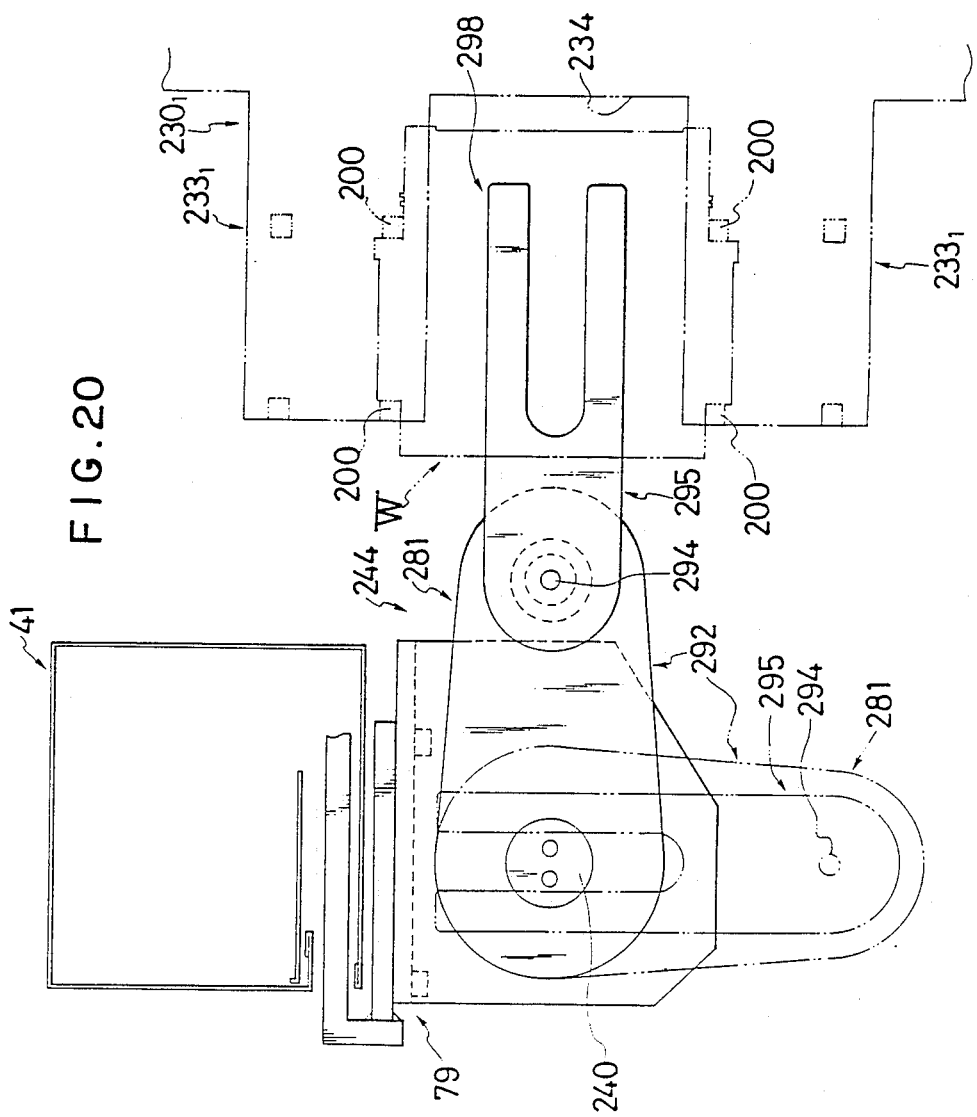
Figure 21:
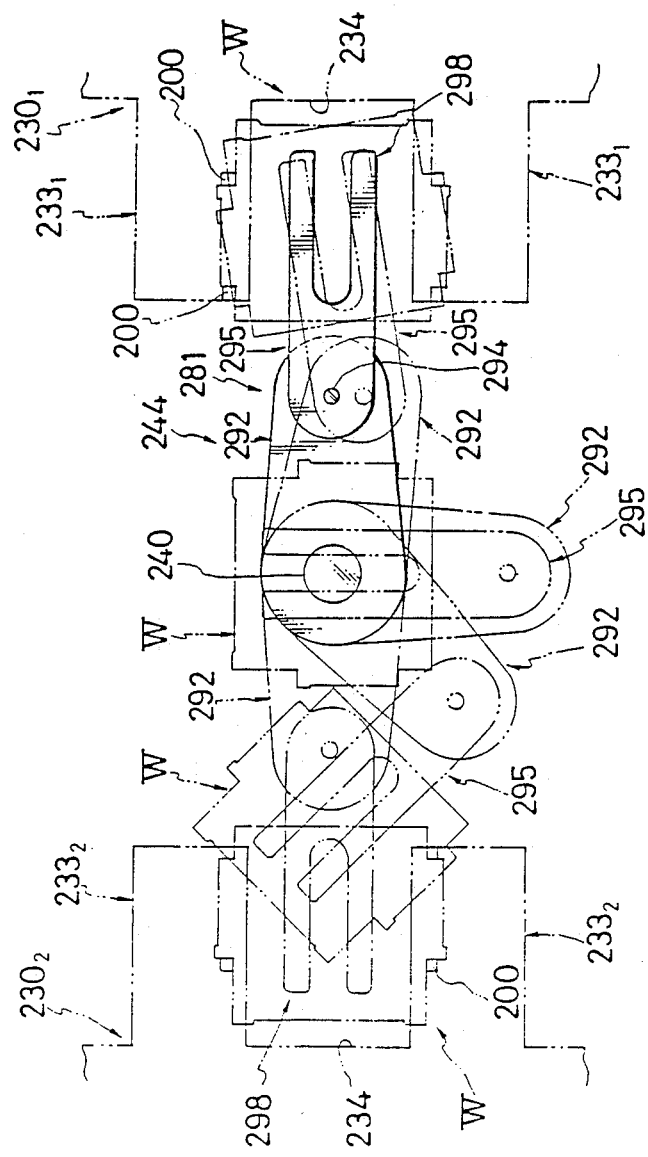

FIGS. 19 to 21 illustrate a modified hand unit 244 employing an arm mechanism 281 which is formed thinner at its fore end to minimize the just-mentioned spaces.

The hand unit 244 includes as its major components the arm mechanism 281, an operating mechanism 282 for operating the arm mechanism 281, and an article transfer means 298 for loading and unloading the article W. This hand unit 244 is vertically movably (toward the upper or lower end in FIG. 19) mounted on the vertical support column 41 which is in turn movable horizontally (in a direction vertical to the face of FIG. 19) along the stationary stockers $230_1$ and $230_2$.

The arm mechanism 281 is arranged as follows:

The arm mechanism 281 is constituted by a box-like drive arm 292 which is rotatable in a horizontal plane (i.e., in a direction vertical to the face of FIG. 19) and securely fixed by screws 291a to an output shaft 291 as will be described hereinafter, a cover 299 closing the opening of the drive arm 292, a link shaft 294 rotatably mounted on the fore end of the drive shaft 292 through a bearing 293, and a follower arm 295 attached to the outer end of the link shaft 294 for rotation in a horizontal plane. The interior of the drive arm 292 is in communication with a suction hole 202.

The operating mechanism 282 is arranged as follows:

The operating mechanism 282 is constituted by a drive motor 280 having a drive shaft 240 parallel with the support column 41 and mounted on the frame 79, an output shaft 291 rotatably supported on the frame 79 through a pair of bearings 241 and 242, a reducing mechanism 290 provided between the drive shaft 291 and the output shaft 240 to transmit the rotation of the drive shaft 240 to the output shaft 290 at a reduced speed, the suction hole 202 for vacuuming the dust out of the arm mechanism 281 (as described hereinafter) by means of a dust collector (not shown), a drive sprocket 212 fixedly mounted on the frame by screws 212a coaxially with the output shaft 291, a driven sprocket 213 forming a pair with the drive sprocket 212 and provided integrally with the link shaft 294, and a chain 214 passed between and around the drive and driven sprockets 212 and 213.

The stock transfer means 298 is formed in a fork-like shape integrally at the fore (i.e. free) end of the follower arm 295. The transfer means 298 which contains no built-in mechanical element is in the form of a thin plate. Described below are stationary stockers $230_1$ and $230_2$ which are suitable for use with the hand unit 244 of this second embodiment.

The stationary stockers $230_1$ and $230_2$ are provided with plural vertically-spaced shelves $233_1$ and $233_2$, respectively. The shelves $233_1$ and $233_2$ have a tapered shape in side view (FIG. 19) and a comb-like shape in plan view (FIG. 20) with gaps or spaces 234 to receive the stock transfer means 98.

In operation, for example, in the case where an article W is transferred from a shelf $233_1$ of the first stationary stocker $230_1$ to a shelf $233_2$ of the second stationary stocker $230_2$ (which are shown on the right and left sides of FIG. 19 respectively), firstly the hand unit 244 is lifted and stopped in a position where the upper surface of the transfer means 298 is a little lower than the shelf $233_1$. At this time, the arm mechanism 281 has the drive and follower arms 292 and 295 in an overlapped state as indicated by the double dot-dash line position in FIG. 20. Next, the drive motor 280 is actuated to rotate the output shaft 291 at low speed through the reducer 290, thereby turning the drive arm 292 horizontally rightward in FIG. 20 (a counterclockwise rotation parallel with the face of the figure). As the drive arm 292 is turned rightward, the link shaft 294 is rotated rightward (clockwise) by the operating mechanism 282 including the drive and driven sprockets 212, 213 and the chain 214, and the follower arm 295 is turned horizontally rightward (clockwise) from the overlapping position on the drive arm 292. As a result, the arm mechanism 281 which consists of the drive and follower arm 292 and 295 is stretched out by horizontal rotational movements so that the stock transfer means 298 approaches the fixed stocker $230_1$ and protrudes below the lower side of the article W. The drive motor 280 is stopped at a time point when the arm mechanism 281 is stretched into a straight form as indicated by solid line in FIG. 20.

Thereafter, the hand unit 244 is slightly lifted up along the support column 41 to scoop up the article W from the shelf $233_1$ due to its engagement with the stock transfer means 298.

Then, the drive motor 280 is actuated again but in the reverse direction to rotate the output shaft 291 leftward (clockwise), whereupon the drive arm 292 is turned horizontally in the clockwise direction and the follower arm 295 is turned horizontally in the counterclockwise direction through the operating mechanism 282.

Accordingly, the drive and follower arms 292 and 295 in the rightwardly stretched or extended state of FIG. 21 are moved away from the first stationary stocker $230_1$ and, after passing through the intermediate overlapped position, are stretched leftwardly toward the second stationary stocker $230_2$. Namely, the arm mechanism 281 which carries the article W on the stock transfer means 298 transfers same from the first stationary stocker $230_1$ to the second stationary stocker $230_2$. In the meantime, the article W is turned horizontally through 180 degrees while moving substantially linearly along a line between the stockers $230_1$ and $230_2$.

The operation of the arm mechanism 281 is stopped at a time point when it is stretched straight to the left (FIG. 21) and in this position the stock transfer means 298 is immediately above the shelf $233_2$ of the second stationary stocker $230_2$. Then, the hand unit 244 is lowered to place the article W on the shelf $233_2$. The ultimate storage position of the article W is determined by projections 200 which are provided on the shelves $233_1$ and $233_2$.

After placing the article W on the second stationary stocker $230_2$ the drive arm 292 is turned horizontally to return the drive and follower arm 292 and 295 to the overlapped position indicated in FIG. 20 in preparation for the next operation.

Figure 22:
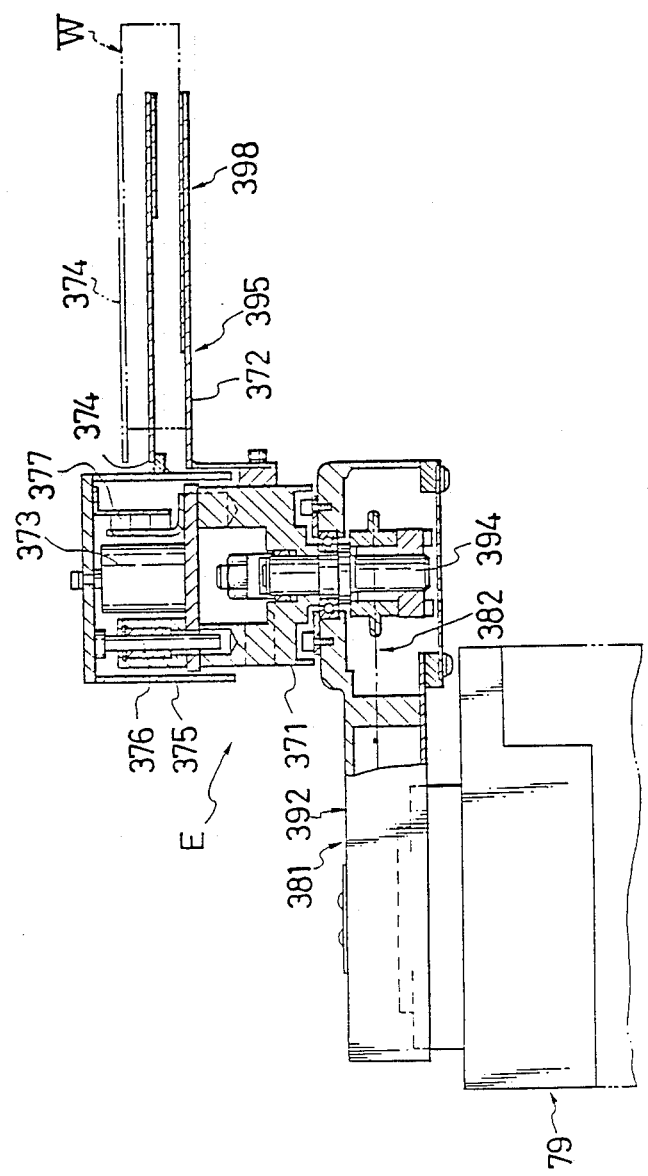
Figure 23:
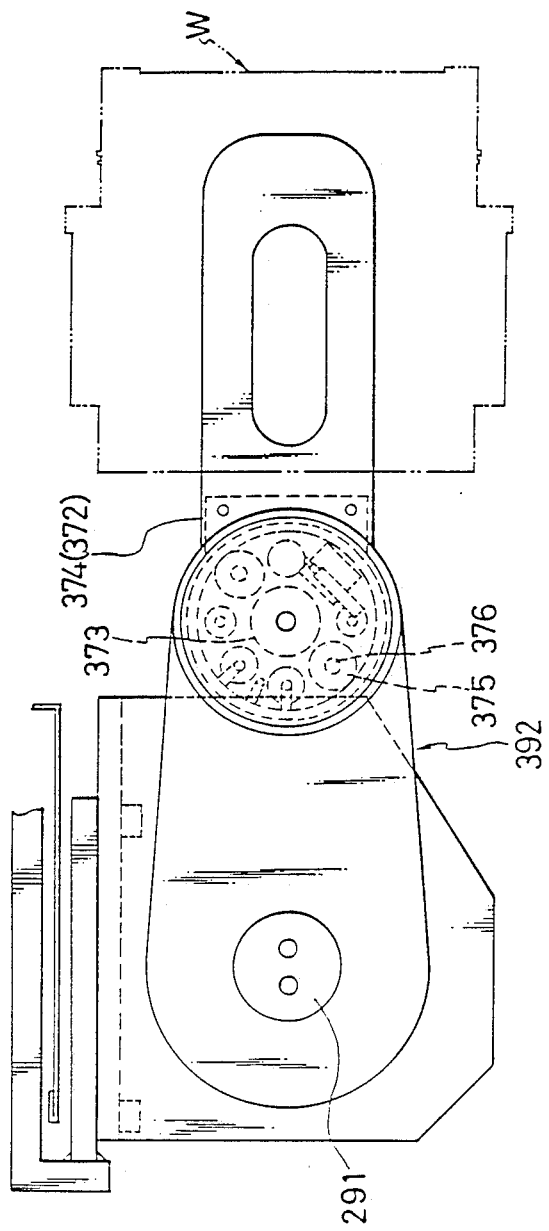
Figure 24A:
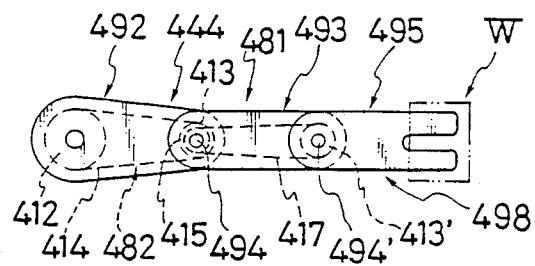
FIGS. 24(a) through 24(d) are diagrammatic plan views of a fourth embodiment of the hand unit.
Figure 24B:
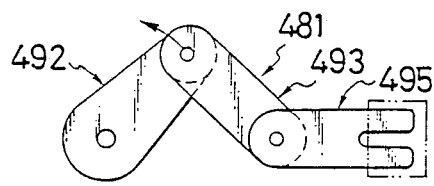
Figure 24C:
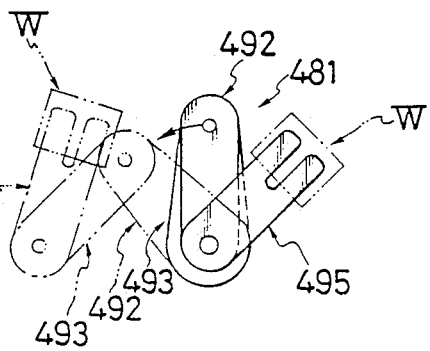
Figure 24D:
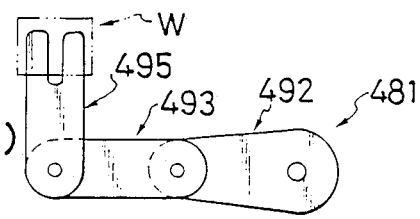
Figure 25:
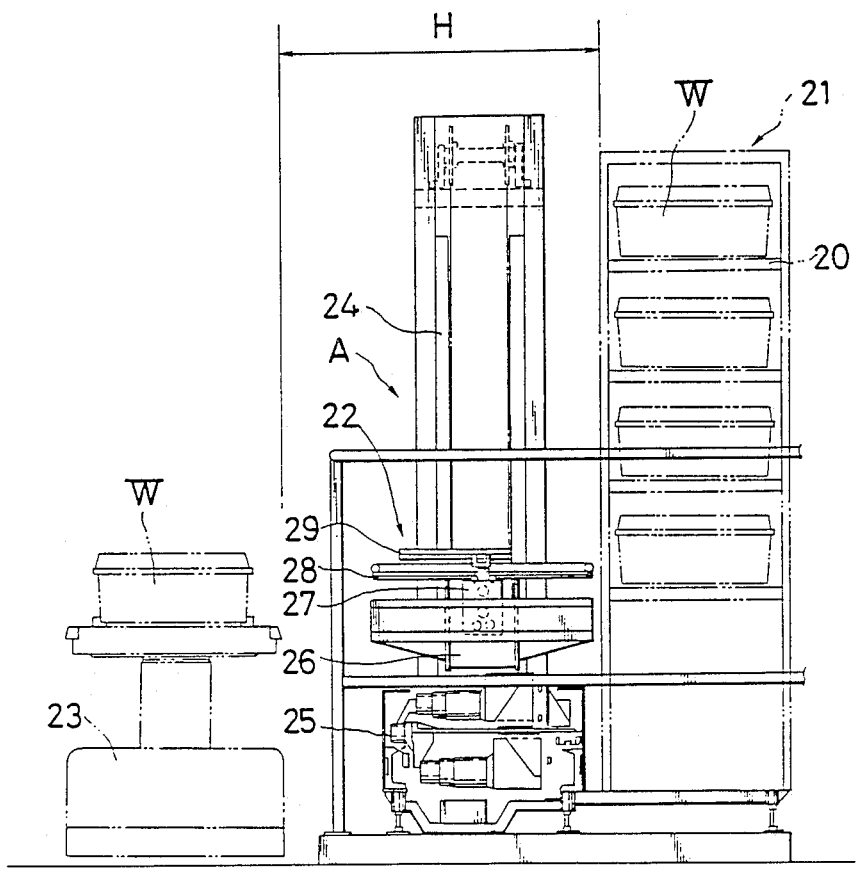
FIG. 25 is a side view of a conventional stock handler.
Figure 26:
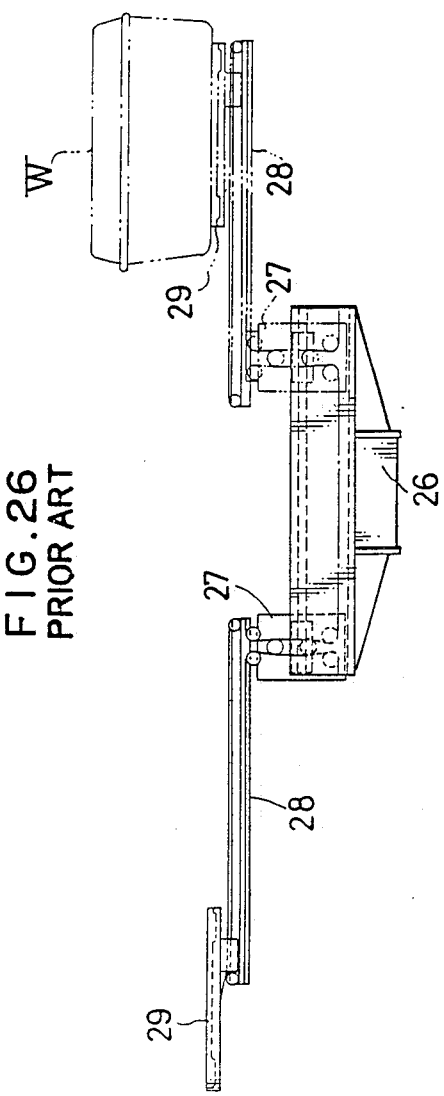
FIG. 26 is a diagrammatic view which is explanatory of the operation of the stock handler of FIG. 25.

Referring now to FIGS. 22 and 23, there is illustrated a hand unit 344 according to a third embodiment, employing a stock transfer means 398 which is arranged to grip an article W from the upper and lower sides to prevent dislocation or dropping of the article W during the transfer.

In this instance, the frame 79, operating mechanism 382 and drive arm 392 of the hand unit 344 are the same in construction as the frame 79, operating mechanism 282 and drive arm 292 of the above-described hand unit 244, respectively.

The stock transfer means 398 is constituted by a cup-shaped support member 371 securely fixed to the outer (i.e. upper) end of the link shaft 394 a lower tongue member 372 horizontally fixed to a side surface of the support member 371, a linear-type actuator 373 (such as a solenoid or a pressure cylinder) fixedly mounted in an upper portion of the support member 371, an upper tongue member 374 adapted to be moved up and down by the actuator 373, an actuator guide 375 and a shaft 376 for restricting rotation of the upper tongue member 374, and a proximity switch 377 for detecting the upward and downward movements of the upper tongue member 374. The upper and lower tongue members 374 and 372 are in the form of thin plates disposed in generally parallel relationship. Of these components, the support member 371 and the root portion of the lower tongue member 372 form the follower arm 395, constituting the arm mechanism 381 in cooperation with the drive arm 392.

The transfer operation using the stock transfer means 398 for gripping the article W is as follows:

Firstly, the upper tongue member 374 is lifted up by the actuator 373 to vertically spread apart the upper and lower tongue members 374 and 372, which are then moved toward the shelf $233_1$ by the operation of the operating mechanism and drive arm 392. As soon as the upper and lower tongue member 374 and 372 come to positions confronting the upper and lower sides of the article W, respectively, the arm mechanism 381 is stopped. In this state, the upper tongue member 374 is lowered by the actuator 373 to grip the article W, and the work handler E as a whole is raised slightly to lift up the work W from the shelf $322_1$.

Thereafter, the gripped article W is transferred to the second stationary stocker $230_2$ and place don the shelf $233_2$ and the upper tongue member 374 is raised to release the article W.

Illustrated in FIG. 24 is a hand unit 444 according to a fourth embodiment, showing in schematic plan view the hand unit which is adapted to turn the direction of the article W 90 degrees and in which an arm mechanism 481 is constituted by drive, intermediate and follower arms 492, 493 and 495.

In this case, the operating mechanism 482 is constituted by a fixed drive sprocket 412 concentric with the axis at the inner end of arm 492, an intermediate shaft 494 rotatably provided on the outer end of drive arm 492, an intermediate sprocket 413 formed integrally with the intermediate shaft 494, a drive chain 414 passed between and around the intermediate sprocket 413 and the drive sprocket 412, a second intermediate sprocket 415 securely fixed on the drive arm 492 within the boundaries of the intermediate arm 493 and concentric with the shaft 494, a follower sprocket 413' formed integrally with a link shaft 494' rotatably provided on the outer end of intermediate arm 493, and a follower chain 417 passed between and around the second intermediate sprocket 415 and the follower sprocket 413'.

The drive and intermediate arms 492 and 493 are each formed in a box-like shape which is suitable for accommodating the component parts of the operating mechanism 482.

The follower arm 495 is substantially in the shape of a thin plate forming the stock transfer means 489 at the fore end thereof.

In operation, as shown in FIG. 24, the arms 492, 493 and 495 are flexed from the state (a) to (d) via (b) and (c) by rotation of the drive arm 492 and by the operating mechanism 482 to transfer an article W while turning its direction 90 degrees on the way.

In this manner, the number of arms can be increased if necessary. In this case, the angle of turning the article may be other than 90 degrees and can be preset freely by changing the number of the sprocket teeth.

As will be appreciated from the foregoing description, the hand units in the second, third and fourth embodiments employ a stock transfer means in the shape of a horizontally turnable thin plate for transfer of the article, permitting one to minimize the arm inserting space and reduce the size of the stocker.

Further, the operating mechanism is accommodated in the box-like drive arm to completely shut off the dust which would otherwise be scattered therearound.

Needless to say, the chains and sprockets which are used for the operating mechanism in the above-described first to fourth embodiments may be replaced by belts and pulleys.

If desired, a magnetic fluid may be used as a sealing means to ensure more secure sealing.

Although a particular preferred embodiment of the invention has been disclosed in detail for illustrative purposes, it will be recognized that variations or modification of the disclosed apparatus, including the rearrangement of parts, lie within the scope of the present invention.

We claim:

1. An article transfer and storage system of the type including an upstanding stationary stocker having a plural number of vertically spaced storage shelves in an upper portion thereof and a stock handler located for movement along the front side of said stationary stocker and having access to the front of said shelves for transferring articles with respect to said shelves, said stock handler including a traveling drive section for movably supporting and moving said stock handler along the front of said stationary stocker, the improvement wherein;
   said traveling drive section of said stock handler is housed internally of and movably guided within a lower portion of said stationary stocker and underlies said shelves, and wherein said storage system includes means for supporting said stationary stocker upon a floor surface.

2. The apparatus of claim 1 in which said traveling drive section is interposed vertically below said shelves and is spaced above said floor surface on which said stationary stocker is supported, stock handler further comprising a support column in front of said shelves, said support column having a bottom portion supported on the front of said traveling drive section such that said support column moves lengthwise along the front of said shelves as said traveling drive section moves beneath said shelves, said stock handler further comprising a lift unit movable up and down along the support column and a lift drive section for moving the lift unit up and down, the lift unit being provided with a hand unit for transferring an article to or from the stationary stocker.

3. The apparatus of claim 2 in which the lift drive section is provided internally of the support column for moving the lift unit up and down, said lift drive section comprising lift motor means within the lower portion of the support column and belt drive means extending from said lift motor means substantially to the upper end of said support column.

4. The apparatus of claim 2 including a rail fixedly provided within the support column and extending vertically and parallel to the support column, said lift unit comprising a support member and bearing means vertically guiding the support member on said vertical rail, said lift unit further including a link member protruding through a vertical slit in the vertical support column, means connecting said support member to said lift drive section for moving said support member up and down within said column, a lift unit frame supported at an end of said link member protruding from said support column, and a hand unit motor fixed on said lift unit frame.

5. The apparatus of claim 2 in which the hand unit is movable with the lift unit and includes an arm mechanism and an operating mechanism for operating the arm mechanism, the arm mechanism comprising a drive arm and motor means connected to one end of the drive arm for pivoting same, an intermediate shaft rotatably supported at the other end of said drive arm, a follower arm connected to said intermediate shaft for pivoting thereby, a follower shaft rotatably supported at a free end of the follower arm, and an article holding member fixed on said follower shaft.

6. The apparatus of claim 5 in which said lift unit includes a frame on which said motor means is fixed, said motor means having an output shaft on which the drive arm is fixed for pivoting due to rotation of said output shaft, said operating mechanism comprising a first positive rotational drive having portions fixed to said frame and intermediate shaft and responsive to pivoting of said drive arm for rotating said intermediate shaft with respect to said drive arm, said operating mechanism further having a second positive rotational drive having portions respectively fixed on said drive arm adjacent said intermediate shaft and fixed on said follower shaft for rotation of said follower shaft with respect to said follower arm upon relative pivoting of said drive arm and follower arm, such that with said drive arm and follower arm extended in a substantially horizontal direction away form the axis of said motor means, the ratios of said first and second positive rotational drives are selected so that the clockwise angular pivoting of said drive arm about the axis of said output shaft causes a corresponding counterclockwise pivoting of the same angular amount of said follower arm about the axis of said intermediate shaft with respect to said drive arm and thereby causes a substantially horizontal movement of said article holding member toward said motor means.

7. The apparatus of claim 6 in which said drive arm and follower arm are of hollow box-like construction and respectively contain said first and second positive rotational drives.

8. The apparatus of claim 6 in which said first and second positive rotational drives are chain and sprocket drives.

9. The apparatus of claim 1 including plural stationary stockers.

10. An article transfer and storage system of the type including a stationary stocker having a plural number of storage shelves and a stock handler provided movably on the front side of said stationary stocker, said stock handler having a traveling drive section movably received in a lower portion of said stationary stocker in which said stock handler comprises an arm mechanism including a drive arm and a follower arm pivotally connected to said drive arm by an intermediate shaft, a follower shaft having an article holder means and provided at an end of said follower arm, and a drive shaft connected to said drive arm for pivotally driving same; and an operating mechanism adapted to convert rotation of said drive shaft into horizontal movement of said follower shaft;

each one of said arms being formed in a box-like shape to accommodate said operating mechanism therein, wherein all of said shafts rotate about parallel horizontal axes.

11. An article transfer an storage system of the type including a stationary stocker having a plural number of storage shelves and a stock handler provided movably on the front side of said stationary stocker, said stock handler having a traveling drive section movably received in a lower portion of said stationary stocker in which the lower portion of the stationary stocker includes a fixed lower rail, an upper rail being fixed on the lower side of the lowermost one of said storage shelves, said rails being to the rear of the front plane of said shelves, said traveling drive section being solely supported by said rails and including means for supporting and guiding same along said upper and lower rails.

12. Article transfer and storage system of the type including a stationary stocker having a plural number of storage shelves and a stock handler provided movably on the front side of said stationary stocker, said stock handler including a traveling drive section movably received in a lower portion of said stationary stocker, said lower portion of said stationary stocker including a fixed lower rail and an upper rail fixed on the lower side of the lowermost one of said storage shelves, said traveling drive section including means for supporting and guiding same on said upper and lower rails, in which said stationary stocker further includes a gear rack parallel to and fixed with respect to said lower rail and said traveling drive section includes a motor means having a pinion meshed with said gear rack for moving said stock handler along said rails.

13. The apparatus of claim 12 in which said traveling drive section includes a cable for providing power to said motor means and a cable protecting mechanism associated with said cable for protecting same.

* * * * *

UNITED STATES PATENT AND TRADEMARK OFFICE
CERTIFICATE OF CORRECTION

PATENT NO. : 4 964 776
DATED : October 23, 1990
INVENTOR(S) : Yuji Wakita et al

It is certified that error appears in the above-identified patent and that said Letters Patent is hereby corrected as shown below:

Column 11, line 51; change the semicolon (;) to a colon ---:---.

Column 12, line 52; change "form" to ---from---.

Column 13, line 23; change "an" to ---and---.

Signed and Sealed this

Twenty-ninth Day of September, 1992

Attest:

DOUGLAS B. COMER

*Attesting Officer*  *Acting Commissioner of Patents and Trademarks*